United States Patent [19]

McLaury

[11] Patent Number: 5,245,578
[45] Date of Patent: Sep. 14, 1993

[54] DRAM WITH A TWO STAGE VOLTAGE PULL-DOWN SENSE AMPLIFIER

[75] Inventor: Loren L. McLaury, Boise, Id.
[73] Assignee: Micron Technology, Inc., Boise, Id.
[21] Appl. No.: 930,138
[22] Filed: Aug. 12, 1992
[51] Int. Cl.[5] .................................. G11C 13/00
[52] U.S. Cl. .................... 365/203; 365/189.05; 365/230.08
[58] Field of Search ........... 365/203, 189.01, 230.01, 365/190, 189.05, 230.08

[56] References Cited

U.S. PATENT DOCUMENTS

| | | | |
|---|---|---|---|
| 4,141,081 | 2/1979 | Horne et al. | 365/203 |
| 4,208,730 | 6/1980 | Dingwall et al. | 365/203 |
| 4,533,843 | 8/1985 | McAlexander, III et al. | 307/530 |
| 4,543,500 | 9/1985 | McAlexander, III et al. | 307/530 |
| 4,606,010 | 8/1986 | Saito | 365/149 |
| 4,634,901 | 1/1987 | McElroy | 307/530 |
| 4,636,987 | 1/1987 | Norwood et al. | 365/208 |
| 4,748,349 | 5/1988 | McAlexander, III et al. | 307/530 |
| 4,962,326 | 10/1990 | Parkinson et al. | 307/443 |
| 5,042,011 | 8/1991 | Casper et al. | 365/205 |

OTHER PUBLICATIONS

"Half-Vdd bit-line sensing scheme in CMOS DRAM's", Journal of Solid-State Circuits, vol. SC-19, No. 4, Aug. 1984.
"Electronic Devices", by Thomas L. Floyd, 2nd ed., pub. by Merrill, a Bell & Howell informations company, Columbus, Ohio.

*Primary Examiner*—Terrell W. Fears
*Attorney, Agent, or Firm*—Michael W. Starkweather

[57] ABSTRACT

There is an integrated circuits that has an improved N-channel sense amplifier that increases the digital one and zero range. The invention spikes the lower voltage digit line closer to ground shortly before equilibrating with the higher voltage digit line.

7 Claims, 4 Drawing Sheets

DRAM WITH A TWO STAGE VOLTAGE PULL-DOWN SENSE AMPLIFIER

FIELD OF THE INVENTION

The present invention relates to integrated circuits (ICs). Particularly, there is a DRAM circuit having an improved N smart sense amp. Uniquely, the invention increases the digital ones range, which will provide a better ones sensing, by lowering the equilibrate voltage level at the end of a row address strobe (RAS) cycle.

BACKGROUND OF THE INVENTION

History

Historically, DRAMs have had relatively large memory cells with large supply voltages. Over the last two decades, the densities of DRAM's has doubled on the average of every year and a half. This rapid increase in bit density is the result of intensive technical efforts by design and process engineers. However, several problems have been created by making smaller and denser DRAMs.

Detection of small voltage signals can be a problem in DRAMs. There are several causes: First, the dynamic sense amplifier circuit is not accurately fabricated in complete balance. Second, the memory array produces a noise which disturbs the small signal detection. Third, the peripheral circuits, such as timing pulse generators, work as a kind of noise source on the sensing circuit. Forth, the stored charge in a memory cell gets so small in a five or less volt device, that it is difficult to sense the digital ones signal. This invention will focus on improving the last problem.

BACKGROUND TECHNOLOGY

The invention uses various materials which are electrically either conductive, insulative or semiconductive. although the completed semiconductor circuit device itself is usually referred to as a semiconductor, predominantly made of silicon and related materials.

In the operation of certain semiconductor circuit devices, such as DRAMs, a sense amp detects and amplifies a very small charge or the absence thereof in a memory cell. U.S. Pat. No. 5,042,011 ('011), having the same assignee as the present invention, describes an N-sense amplifier pull-down device, and is herein incorporated by reference for pertinent and compatible material. In the '011 patent, it is described how the digit and digit bar (digit*) lines are separated in voltage during a memory cell's read cycle. FIG. 1, in the present invention, illustrates the voltage separation discussed in the '011 patent, and also further illustrates the subsequent voltage changes that take place when reading a stored ones charge in a memory cell.

The elements in the FIG. 1 are as follows: Vcc is the supply voltage, currently this is usually about 3 to 12 volts; digit lines can be pulled up to this level as illustrated. Vt is the voltage threshold level described in the referenced patent, usually around 0.6 volts. Precharge circuit voltage is usually about Vcc/2. After amplifying the voltage separation on the two lines, digit and digit bar, they are equilibrated or soft clamped together and precharged in preparation for the beginning of the next cycle. A ones margin, and its complement zeros margin, generally refers to the difference between voltages of a stored one or zero charge in a cell and the equilibrated voltage level on the digit lines. A large charge or voltage difference increases cell reading accuracy and ease.

PROBLEM

As described in the history section, DRAMs have had difficulty in reading small signals. As DRAMs have decrease in supply voltages, Vcc from 12 to 5 and 3, or less, the ones and zeros margin's have decreased. As these margins have progressively decrease there has been an increase of ones reading errors, called soft errors. Specifically, a soft error occurs when a cell's ones charge is being read as a zeros charge. Therefore, there is a need to maximize these margins to overcome the soft errors occurring during the one's reading.

A second problem originates from the minimum voltage threshold Vt level needed on each digit line. If a digit line falls below this level, memory cells coupled to the digit line will have an increased rate of charge leakage. Increased rates of charge leakage means that the provided timing of the refresh cycle will not get to the memory cell soon enough to recognize that the cells need to be refreshed; the cell's ones charge is mistaken for a zeros charge now. One skilled in the art will understand the relationship between the voltage on the digit lines and the charge leakage rates in cells requiring faster refresh cycle timings and the associated added power costs.

It is noted that the above described problem, as well as other problems, are solved through the subject invention and will become more apparent, to one skilled in the art, from the detailed description of the subject invention.

SUMMARY OF THE INVENTION

A feature of the invention includes an N-Smart-sense-Amp (NSSA) electrically coupled to the N-Sense-Amp (NSA). This combined circuitry will create a better ones and zeros margin by decreasing the voltage level of the digit lines for a short period of time just before equilibrating the digit lines. Moreover, advantageously, there is appreciably no effect to the stored ones charges in the memory cells connected to the subject digit line.

This feature as well as other features of the present invention will become more clear from the following detailed description of the invention, taken in conjunction with the accompanying drawings.

BRIEF DESCRIPTION OF THE DRAWINGS

It is noted that the drawings of the invention are not to scale. The drawings are merely schematic representations, not intended to portray specific parameters of the invention. Additionally, like numbering in the drawings represent like elements within and between drawings.

DETAILED DESCRIPTION OF THE ILLUSTRATED EMBODIMENT

Incorporated Material

The following U.S. patent is herein incorporated by reference: U.S. Pat. No. 4,962,326, having same assignee as the present invention, is a reduced latchup in precharging I/O lines to sense amp signal levels. U.S. Pat. No. 4,748,349 is a high performance dynamic sense amplifier with voltage boost for row address lines. U.S. Pat. No. 4,636,987 is a semiconductor dynamic memory device with multiplexed sense amplifier and write activated active loads. U.S. Pat. No. 4,634,901 is a Sense amplifier for CMOS semiconductor memory devices having symmetrically balanced layout. U.S. Pat. No. 4,606,010 is a dynamic memory device. U.S. Pat. No. 4,533,843 is a high performance dynamic sense amplifier with voltage boost for row address lines. U.S. Pat. No. 4,543,500 is a high performance dynamic sense amplifier voltage boost for row address lines. U.S. Pat. No. 4,141,081 is a MNOS BORAM sense amplifier latch.

For the purpose of providing background material which may in some respects illustrate the state of the art, the following article and book are herein incorporated by reference: Half-Vdd bit-line sensing scheme in CMOS DRAM's, Journal of solid-state circuits, vol. sc-19, no. 4, August 1984. Electronic Devices, by Thomas L. Floyd, 2nd ed., pub. by Merrill, a Bell & Howell informations company, Columbus, Ohio.

Definitions

In the specification references are made to a digit line, this is referring to either digit or its complement digit bar. If there is a reference to a specific digit line, then the accompanying element number will be included. Similarly, a reference digit line is a digit line not having its memory cell addressed, and is used for comparing whether a ones or zeros signal was received on the other digit line that has its memory cell addressed.

It is noted that this definitions section, in no way is meant to limit the scope of the defined words. The provided definitions are not meant to be exact and complete scientific or linguistic definitions. These definitions are only meant to be an assistance to the readers in a broad, and at times less than complete, manner.

GENERAL EMBODIMENT

Figure 2:
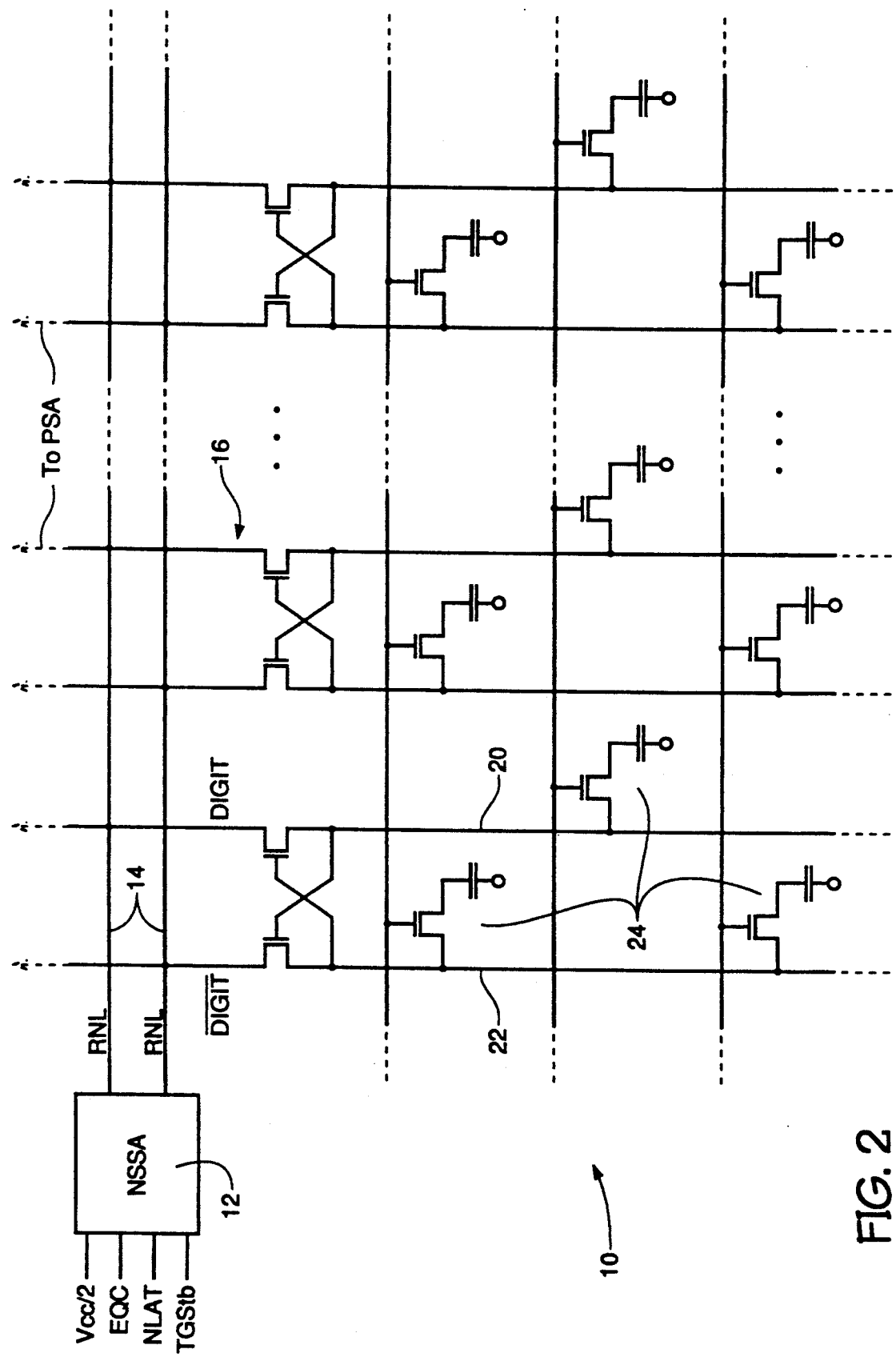
FIG. 2 is an illustration of a common DRAM array circuit.

As illustrated in FIG. 2, the DRAM 10, in which only part of a DRAM is illustrated, comprises the following elements: A N-Smart-Sense (NSSA) 12 a plurality of N-sense-amps (NSA) 16, and row N-sense-amp latch (RNL) lines 14, coupled between NSSA 12 and all the NSAs 16 form the complete circuit for pulling one of the digit lines towards a grounded voltage. NSA is an N-channel cross coupled transistor device. NSAs pulls down the voltage level of either digit 20 or digit bar 22, whichever line has the lower voltage. Often the combination of these three parts (12,14, and 16) are referred to as a pull-down circuit.

P-Sense Amps (PSA), not shown, do the opposite of the NSA, they pull-up the voltage of the remaining digit line towards supply Vcc.

SPECIFIC EMBODIMENT OF THE INVENTION

Figure 1:
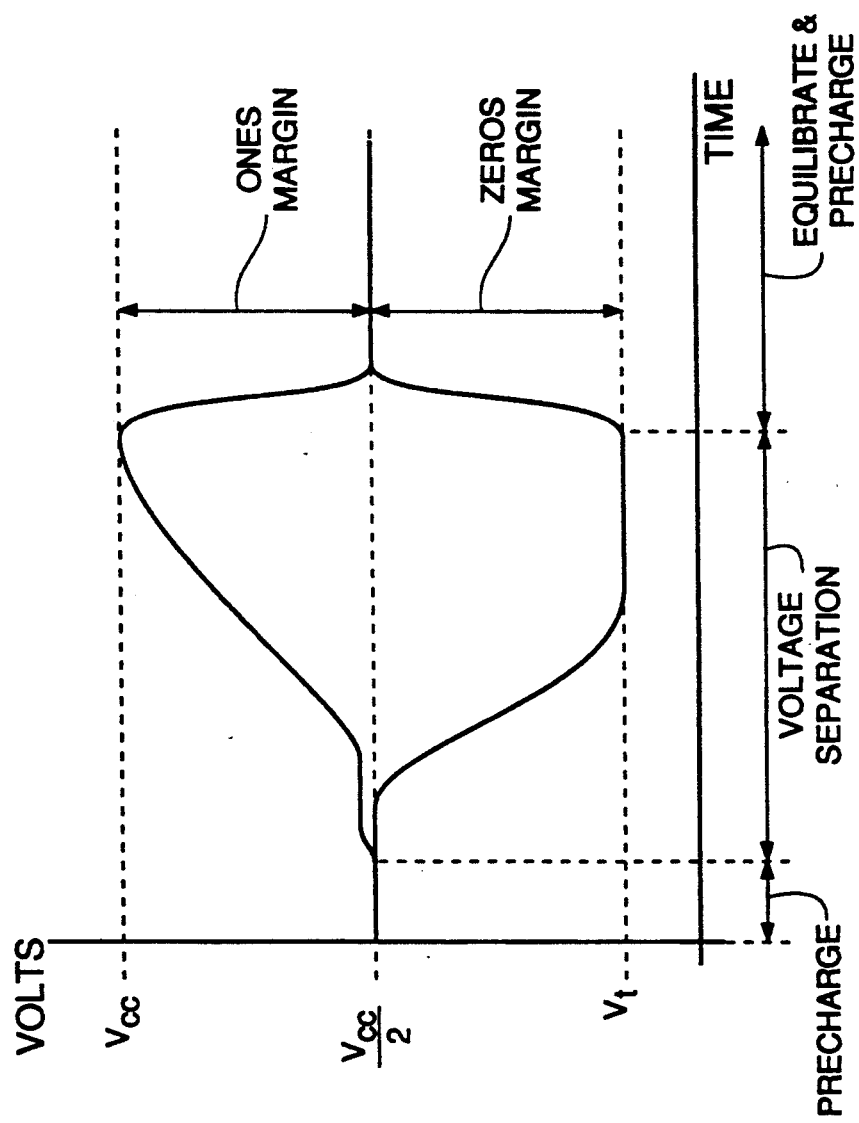
FIG. 1 is an illustration of the voltage levels of digit and digit bar during a row access cycle.
Figure 3:
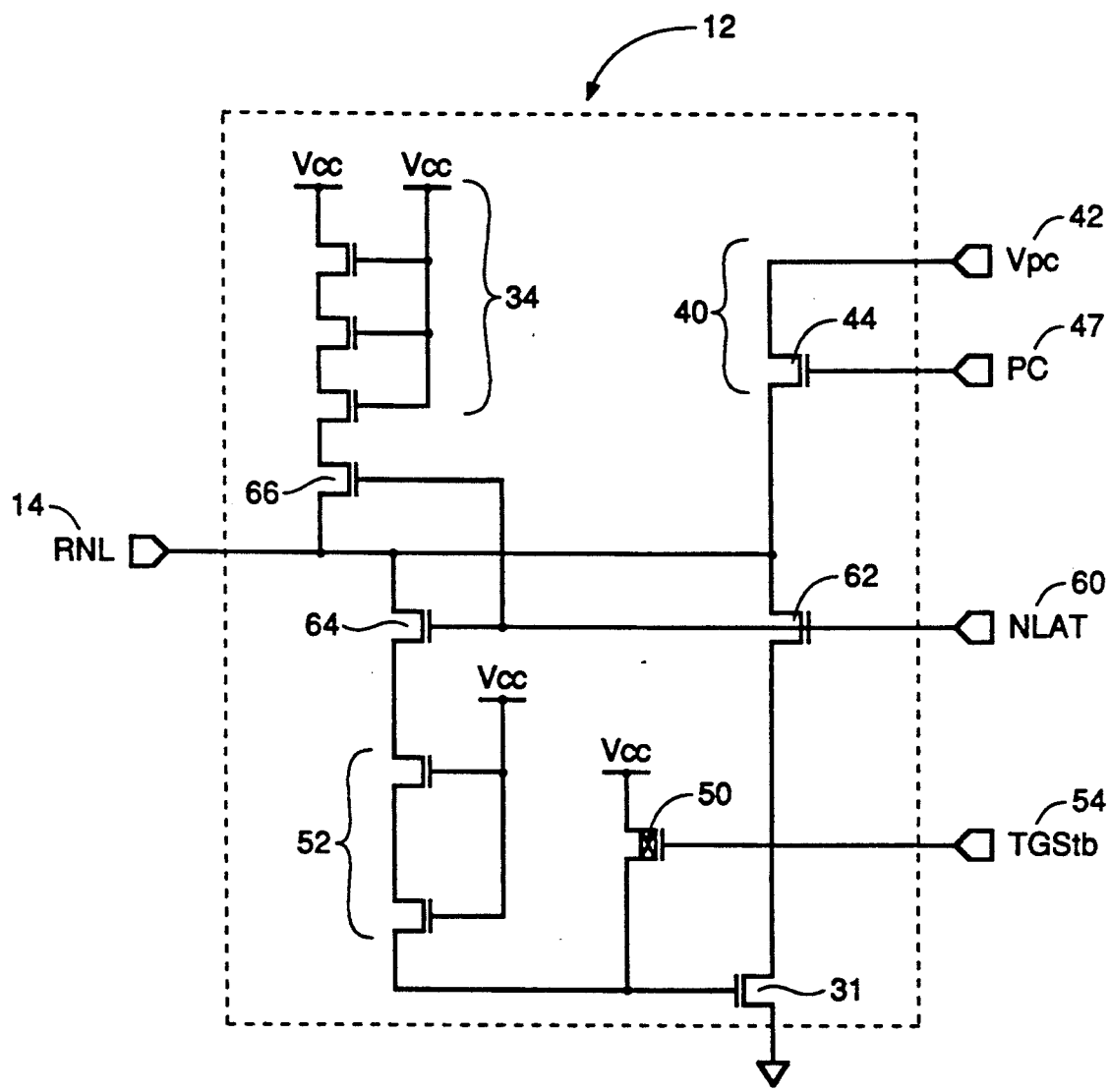
FIG. 3 is one embodiment of a circuit diagram which implements the invention.

In reference to FIGS. 1-3, there is a detailed illustration of the N-Smart-Sense-Amp (NSSA) 12, and includes the following elements: Entering NSSA 12 from the N-Sense-amps 16 is line RNL 14 which connects to control transistor 31 via switch transistor 62 which is triggered off of NLAT 60. Connected to RNL, via switch transistor 66, is a trickle current supply circuitry 34, having three serial transistors feeding a trickle of current from Vcc to RNL 14, and having each of the transistor's gates coupled to Vcc supply. Switch transistor 66 selectively connects trickle current supply circuitry 34 to RNL 14.

Precharge circuitry 40 comprises an input from a precharge voltage level (Vpc) 42, usually set for a Vcc/2 voltage level, and a switching transistor 44, which has its gate controlled by a precharge signal (PC) 47.

Transistor gate circuit 52 has two serial transistors with their gates connected to Vcc, and is coupled to RNL line 14 and the gate of control transistor 31. Switch transistor 64 selectively connects transistor gate circuitry 52 to RNL 14. A P-type temporary ground strobe transistor 50 has its source connected to Vcc, and its gate connected to a temporary ground strobe signal (TGStb) 54 which when being high will prevent current from passing through transistor 50.

Switch transistor 62, will isolate NSA 16 from control transistor 31. Switch transistors 62, 64, and 66, have their gates controlled by N-sense-amp latch signal (NLAT) 60.

Figure 4:
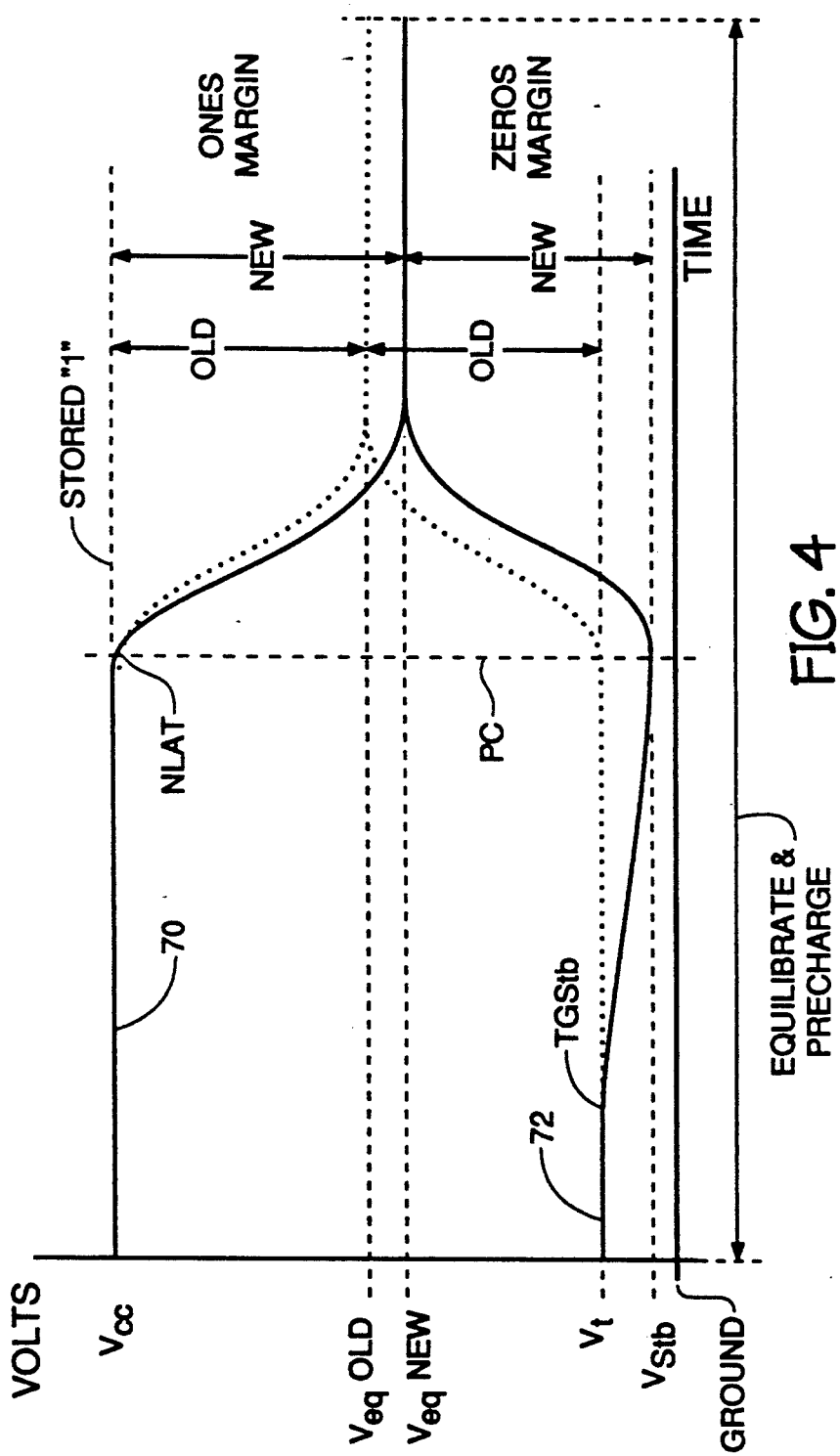
FIG. 4 is an illustration of the voltage levels of digit and digit bar during the latter part of a row address cycle when using the invention of FIG. 3.

FIG. 4 is a voltage vs. time graph for both digit line 70, which is receiving a ones charge, and digit bar line 72 with the associated RNL line voltage, as compared between prior art-DRAM architecture (as related in FIG. 1, and herein indicated by the doted lines) and a DRAM utilizing the NSSA circuitry 12 (indicated by the solid line). In reference to the prior figures and discussion, the graph contains the following:

Vcc is the supply voltage level and the voltage level that a stored "1" is charged to. Vpc is the precharge voltage level initiated before every address cycle. Veq OLD is the equilibrated voltage of FIG. 1. Veq NEW is the equilibrated voltage when using NSSA circuitry. Vt is the threshold voltage. Vstb is the voltage of line RNL after the NSSA is activated. TGStb indicates the time that the TGStb signal 54 is turned low for activating temporary ground strobe transistor 50 and causing the voltage of RNL 72 to pull further down to ground. NLAT indicates when NLAT 60 is turned off for initiating the equilibration sequence. PC indicates the timing of initiating the precharging circuitry 40.

OPERATION

In reference to FIGS. 1-4, and for illustrative purposes, the operation of NSSA 12 while addressing a ones charged memory cell on digit line 20, is generally operated as follows: PC 47 turns transistor 44 off, thus allowing RNL 14 to float. TGStb 54 goes high shutting off transistor 50. Digit line 20, receives the stored ones charge from the addressed cell. NSA 16 pulls down the digit bar 22 toward Vt. Digit line 20 (having the ones signal on it from the memory cell) is pulled up toward Vcc, by a P-sense-amp (not shown). As a result, there are two voltage levels, a high-level 70 on digit line 20, reaching up to Vcc and stabilizing, and a low voltage level 72 found on RNL 14 and digit bar 22, which approaches and stabilizes at Vt. The gate of transistor 31 starts high them is discharged through transistor 64 and 52 during initial access. The gate of transistor 31 is left with enough voltage to conduct the leakage current supplied by the leakage circuitry 34. It is noted that FIG. 4 is not to accurate scale, but is merely illustrative of the timing sequences and results.

At the end of a row access cycle, there is a row line shut-down period, usually referred to as equilibrating the row lines in preparation for the next row access cycle. The invention pulls the equilibrate voltage levels lower by having the TGStb signal temporarily strobing low. Whereby, transistor 50 opens to a full Vcc onto the gate of control transistor 31; thus, control transistor 31 now lets allot of current out of RNL. RNL and digit bar drop to a lower voltage, Vstb. NLAT 60 goes low, starting the equilibrating of the digit lines, and shutting off all three switch transistors 62, 64, 66, thus trapping the lower voltage on the lines. Shortly after NLAT fires, precharge circuitry 40 is opened, thereby assisting the digit line's voltages to be pulled together or equilibrated. More specifically, after NLAT is low, the high voltage level provided from the P-Sense-amp is disconnected, and the new lower Vstb voltage level is established over the whole circuit. PC 47 turns on transistor 44, thus providing a voltage precharge supply Vpc to line RNL 14 and associated circuitry in preparation for the next read cycle. As a result of this circuit sequence, there is a single lower equilibrated voltage level, Veq, that will provide the better one and zero margin for the next cycle.

Experimental evidence has demonstrated that by providing NSSA 12 on a DRAM, there is about a 26% increase in the ones margin, and about a 6% zeros margin improvement in a four volt DRAM device. While a five volt device has shown about a 21% ones margin improvement, and similar zeros margin improvement. This range is roughly indicated on FIG. 4 by the old and new ones and zeros margin lines.

REMARKS ABOUT THE INVENTION

It is noted that RNL 14 has its voltage pulled below Vt for a relatively shorter time than the time it remains at Vt. This short extra pull-down timing ensures that there is little impact to the leakage rate of the ones charge stored in memory cells located on the digit lines.

It is also noted that the voltage provided by precharge circuitry 40 is matched to be close to the equilibrate voltage level. This circuit aids in clamping and quickly achieving the chosen equilibrated voltage level Veq.

VARIATIONS IN THE INVENTION

There are several obvious variations to the broad invention and thus come within the scope of the present invention. Uniquely, this invention may work with varying numbers and sizes of transistors in all of the various circuits. P and N channel devices can be switched around. The voltage that the ones signal is charged to, Vcc, can be varied to be less that Vcc or higher. The digit lines being pulled to Vcc could also have the voltage levels variable.

While the invention has been taught with specific reference to one embodiment, someone skilled in the art will recognize that changes can be made in form and detail without departing from the spirit and the scope of the invention.

Although subheadings are used, such as found in the Detailed Description of the Illustrated Embodiment, these are merely provided for assisting the reader; wherein, the writer is free to enter any information under any heading/s.

I claim:

1. A semiconductor device, comprising:
 a memory array having:
 a first and second memory cell (24) capable of storing electrical charge indicative of a ones or zeros signal;
 a digit line (20) connected to the first memory cell, having a first initial voltage level;
 a digit bar line (22) connected to the second memory cell, having a second initial voltage level;
 a cross coupled N-Sense amplifier (16), connected to digit and digit bar lines, having means for pulling one of the first and second initial voltage levels to a first low voltage level;
 a line (14), connected to the N-sense amplifier; and
 a N-smart-sense amplifier (12), electrically connected to the N-Sense amplifier (16) via line (14), having means for pulling the first low voltage level to a second lower voltage level.

2. A dynamic random access memory device having a digit and digit bar line both at a first voltage level, comprising:
 a N-Sense amplifier (16), having means for pulling the digit and digit bar line down to a second voltage level lower than the first voltage level;
 a line (14), connected to the N-sense amplifier; and
 a N-smart-sense amplifier (12), electrically connected to the N-sense amplifier (16) via line (14), having means for pulling down the second voltage level to a third voltage level that is lower than the second voltage level.

3. An N-Smart-Sense-Amp (NSSA) (30), comprising:
 an electrical input line RNL (14) having a first voltage level;
 a control transistor (31), electrically connected to the line RNL;
 a leakage current supply circuitry (34), electrically connected to the line RNL before the control transistor (31), having means for supplying a voltage threshold to the line RNL;
 a precharge circuitry (40), electrically connected to the line RNL before the control transistor (31) and after the Vt leakage current supply circuitry (34), having means for precharging the line RNL to the first voltage level;
 a transistor gate circuit (52), electrically connected to the RNL line before the precharge circuitry (40) and after the Vt leakage current supply circuitry (34), and connected to the gate of control transistor (31), having means for providing a first current through the control transistor (31) from the line RNL and for creating a second lower voltage level on line RNL;
 a temporary ground strobe transistor (50), electrically connected to the transistor gate circuit (52), having means for providing a second current through the control transistor (31) from the line RNL and for creating a third lower voltage level on line RNL; and
 a latch circuitry (60, 62, 64, and 66), having means for electrically de-connecting, from the line RNL, the transistor gate circuit (52), the Vt leakage current supply circuitry (34), the temporary ground strobe transistor (50), and the control transistor (31).

4. The N-Smart-Sense-Amp (NSSA) (30) of claim 3, wherein the Vt leakage current supply circuitry 34 further comprises three serial transistors with their gates coupled to Vcc supply.

5. The N-Smart-Sense-Amp (NSSA) (30) of claim 3, wherein the precharge circuitry further comprises: an input from a precharge voltage level 42, and a switching transistor 44, which has its gate controlled by a precharge signal 47.

6. The N-Smart-Sense-Amp (NSSA) (30) of claim 3, wherein the transistor gate circuit (52) further comprises two serial transistors with their gates connected to Vcc.

7. The N-Smart-Sense-Amp (NSSA) (30) of claim 3, wherein the temporary ground strobe transistor (50) further comprises: a supply node connected to Vcc, and the gate connected to a temporary ground strobe signal (54) which is on, or high, for preventing current from passing from the source to the drain of the temporary ground strobe transistor 50.

* * * * *